(12) United States Patent
Kato (10) Patent No.: US 10,903,286 B2
(45) Date of Patent: Jan. 26, 2021

(54) DISPLAY DEVICE

(71) Applicant: Japan Display Inc., Tokyo (JP)

(72) Inventor: Daisuke Kato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/523,081

(22) Filed: Jul. 26, 2019

(65) Prior Publication Data

US 2019/0348476 A1    Nov. 14, 2019

Related U.S. Application Data

(63) Continuation of application No. PCT/JP2017/042987, filed on Nov. 30, 2017.

(30) Foreign Application Priority Data

Feb. 1, 2017    (JP) ................. 2017-016739

(51) Int. Cl.
    *H01L 27/32*    (2006.01)
    *G06F 3/041*    (2006.01)
    (Continued)

(52) U.S. Cl.
    CPC .......... *H01L 27/323* (2013.01); *G06F 3/0412* (2013.01); *G06F 3/0443* (2019.05);
    (Continued)

(58) Field of Classification Search
    CPC ... H01L 27/323; H01L 51/5253; H01L 51/50; H01L 27/3246; H01L 2227/323;
    (Continued)

(56) References Cited

U.S. PATENT DOCUMENTS

2015/0060817 A1    3/2015  Sato et al.
2015/0108434 A1*   4/2015  Tian ................. H01L 51/56
                                                    257/40
(Continued)

FOREIGN PATENT DOCUMENTS

JP        2015-050245 A    3/2015

OTHER PUBLICATIONS

International Search Report dated Jan. 16, 2018 for corresponding International Application No. PCT/JP2017/042987.
(Continued)

*Primary Examiner* — Vinh T Lam
(74) *Attorney, Agent, or Firm* — Michael Best & Friedrich LLP (57) ABSTRACT

A display device includes a circuit layer, a plurality of display elements arranged on the circuit layer, a sealing layer arranged on the plurality of display elements, a protective later arranged on the sealing layer, a touch electrode layer arranged on the protective layer, and a plurality of connection terminals arranged on the circuit layer and an exterior side of the sealing layer. The circuit layer includes a plurality of connection wirings respectively connected to any one the plurality of connection terminals, the protective layer includes a plurality of opening parts respectively in a region overlapping a part of each of the plurality of connection wirings, the touch electrode layer has a plurality of touch electrodes overlapping the display element, and each of the plurality of touch electrodes is connected to any one of the plurality of connection wirings via any one of the plurality of opening parts respectively.

12 Claims, 9 Drawing Sheets

(51) Int. Cl.
*G06F 3/044* (2006.01)
*H01L 51/52* (2006.01)

(52) U.S. Cl.
CPC ........ *G06F 3/0446* (2019.05); *H01L 27/3276* (2013.01); *H01L 51/5253* (2013.01); *H01L 2227/323* (2013.01)

(58) Field of Classification Search
CPC ............... H01L 27/3276; G06F 3/0446; G06F 3/04164; G06F 3/0445; G06F 3/0412; G06F 3/0443; H05B 33/02; H05B 33/06; H05B 33/12; H05B 33/22; H05B 33/04; G09F 9/30
See application file for complete search history.

(56) References Cited

U.S. PATENT DOCUMENTS

| | | | | |
|---|---|---|---|---|
| 2015/0144920 A1* | 5/2015 | Yamazaki | ............ | H01L 27/323 257/40 |
| 2015/0242033 A1* | 8/2015 | Ham | .............. | G09G 3/3648 345/174 |
| 2015/0255518 A1* | 9/2015 | Watanabe | ............. | H01L 27/124 257/40 |
| 2015/0309637 A1* | 10/2015 | Sakuishi | ............ | H01L 27/1214 345/174 |
| 2015/0362776 A1* | 12/2015 | Jikumaru | ............ | H01L 27/1248 349/12 |
| 2015/0364507 A1* | 12/2015 | Won | ............. | H01L 27/1248 257/43 |
| 2016/0034085 A1* | 2/2016 | Lee | ............ | G02B 30/00 349/12 |
| 2016/0035797 A1* | 2/2016 | Yamazaki | ......... | G02F 1/133305 257/88 |
| 2016/0124557 A1* | 5/2016 | Choi | ............ | G06F 1/1626 345/173 |
| 2016/0190055 A1* | 6/2016 | Jinbo | ............. | G06F 3/013 257/99 |
| 2016/0190216 A1* | 6/2016 | Yang | ............ | H01L 27/3276 257/91 |
| 2016/0226019 A1* | 8/2016 | Yamazaki | ........... | H01L 51/0097 |
| 2016/0307971 A1 | 10/2016 | Jeon | | |
| 2016/0328058 A1* | 11/2016 | Peng | ............ | H01L 27/1222 |
| 2016/0343954 A1* | 11/2016 | Seo | ............ | H01L 51/0061 |
| 2016/0349558 A1 | 12/2016 | Shishido et al. | | |
| 2017/0025444 A1* | 1/2017 | Hirakata | ............ | H04B 1/3833 |
| 2017/0033172 A1* | 2/2017 | Yamazaki | ............. | G06F 3/0416 |
| 2017/0062528 A1* | 3/2017 | Aoyama | ............ | G02F 1/133514 |
| 2017/0131594 A1* | 5/2017 | Nakada | ............ | H01L 51/5206 |
| 2017/0155072 A1* | 6/2017 | Hashimoto | ........... | H01L 27/322 |
| 2017/0220151 A1* | 8/2017 | Zhou | ............ | G06F 3/0412 |
| 2017/0222059 A1* | 8/2017 | Chen | ............ | H01L 27/1248 |
| 2018/0054861 A1* | 2/2018 | Naito | ............ | F21V 23/00 |
| 2018/0081470 A1* | 3/2018 | Li | ............ | G06F 3/0416 |
| 2019/0363266 A1* | 11/2019 | Tanaka | ............ | H01L 51/56 |

OTHER PUBLICATIONS

Korean Office Action dated Nov. 4, 2020 for the corresponding Korean application No. 10-2019-7024307, with English machine translation.

* cited by examiner

FIG. 8

DISPLAY DEVICE

CROSS REFERENCE TO RELATED APPLICATIONS

This application is based upon and claims the benefit of priority from the prior Japanese Patent Application No. 2017-016739, filed on Feb. 1, 2017, and PCT Application No. PCT/JP2017/042987 filed on Nov. 30, 2017, the entire contents of which are incorporated herein by reference.

FIELD

An embodiment of the present invention is related to a display device. One embodiment of the present invention disclosed in the present specification is related to a display device mounted with a touch sensor.

BACKGROUND

A touch sensor is used as an input interface for operating a display device or an information terminal device. A touch sensor provided so as to overlap the screen of a display device, it is possible for a user to operate input buttons or icons displayed on the screen, and information can be easily input to the display device. A capacitive touch sensor is often used in a display device which has such an input function. In a capacitive touch sensor, an electrode (also called a "touch electrode") for generating a capacitance is arranged on a sensing surface. For example, a display device which has an input function called an in-cell type in which a touch electrode is arranged inside a panel is known (for example, refer to Japanese Laid Open Patent Publication No. 2015-050245).

SUMMARY

A display device according to an embodiment of the present invention includes a circuit layer arranged on a first surface of a substrate, a plurality of display elements arranged on the circuit layer, a sealing layer arranged on the plurality of display elements, a protective later arranged on the sealing layer, a touch electrode layer arranged on the protective layer, and a plurality of connection terminals arranged on the circuit layer and an exterior side of the sealing layer. The circuit layer includes a plurality of connection wirings respectively connected to any one the plurality of connection terminals, the protective layer includes a plurality of opening parts respectively in a region overlapping a part of each of the plurality of connection wirings, the touch electrode layer has a plurality of touch electrodes overlapping the display element, and each of the plurality of touch electrodes is connected to any one of the plurality of connection wirings via any one of the plurality of opening parts respectively.

DESCRIPTION OF EMBODIMENTS

A display device according to an embodiment of the present invention will be described in deal with reference to the drawings. The display device of the present invention is not limited to the following embodiments, and can be modified into various aspects. In the following embodiments, the same elements are denoted by the same reference number. Further, a dimension ratio of the drawing may differ from the actual ratio for convenience of description, or a part of the structure may be omitted the drawing.

First Embodiment

Figure 1:
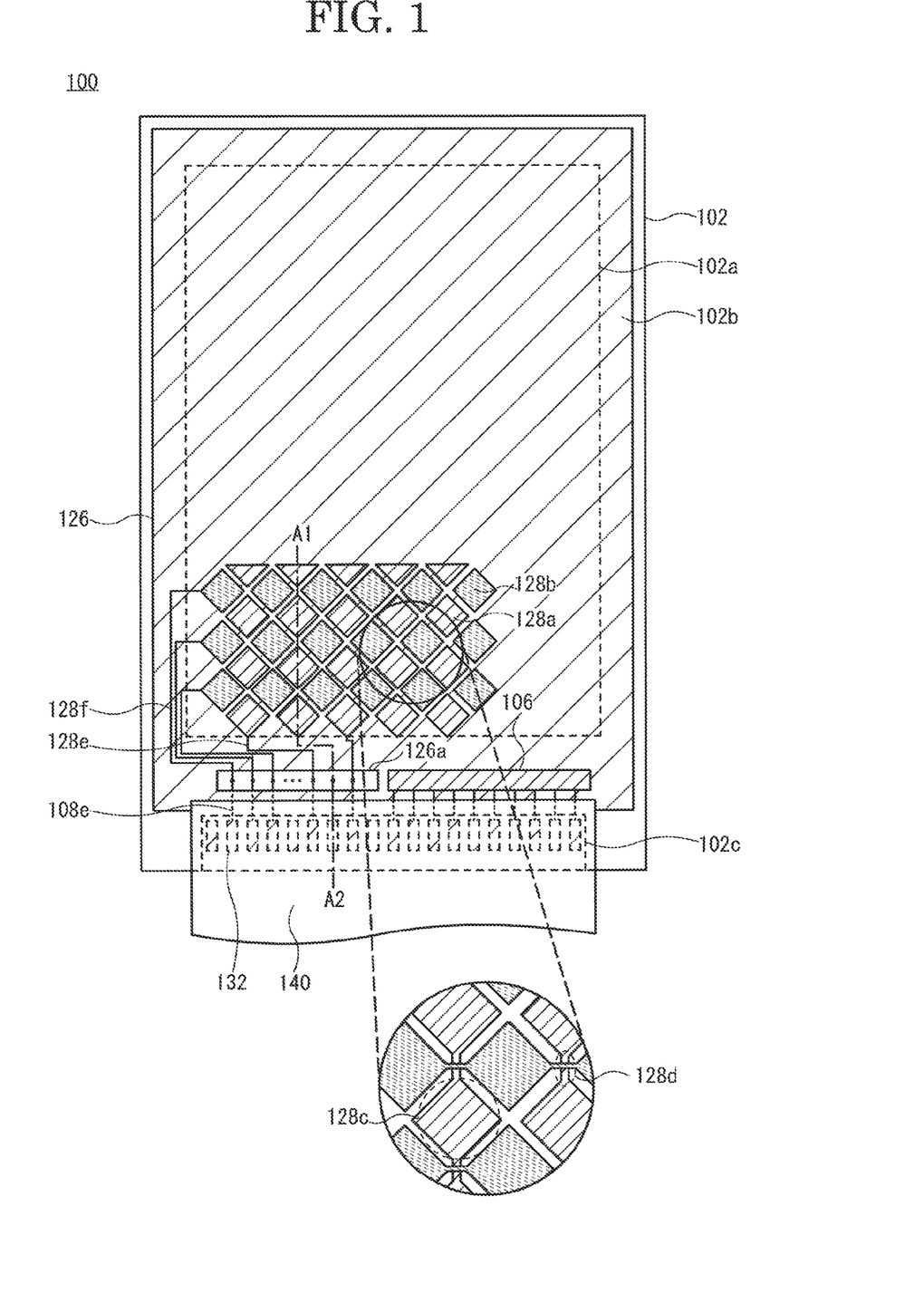
FIG. 1 is a top view diagram for explaining the structure of a display device related to one embodiment of the present invention.

FIG. 1 is a top view diagram for explaining a structure of a display device 100 having an input function related to the present embodiment. The display device 100 is arranged with a display region 102a, a periphery region 102b and a terminal region 102c on a first surface of a substrate 102.

The display region 102a is a region for displaying an image. A plurality of display elements is arranged in the display region 102a (not shown in FIG. 1). A light emitting element having a light emitting layer including an organic electroluminescent material between a pair of electrodes, or a liquid crystal element in which a liquid crystal layer is provided between a pair of electrodes or the like is applied as a display element. The plurality of display elements is arranged in a matrix in two directions which intersect each other. Each of the plurality of display elements is connected to a pixel circuit (not shown in FIG. 1) for controlling the operation thereof.

A plurality of touch electrodes is arranged on the plurality of display elements in the display region 102a. Each of the plurality of touch electrodes is formed from a plurality of first touch electrodes 128a and a plurality of second touch electrodes 128b. In the present embodiment, each of the plurality of first touch electrodes 128a has a plurality of rectangular regions 128c and a connection region 128d which connects rectangular regions 128c adjacent in a first direction among the plurality of rectangular regions 128c. Each of the plurality of first touch electrodes 128a is arranged electrically insulated from a first touch electrodes 128a adjacent in a second other direction (direction intersecting a first direction). Similarly, each of the plurality of second touch electrodes 128b has a plurality of rectangular regions 128c and a connection region 128d which connects rectangular regions 128c adjacent in a second direction among the plurality of rectangular regions 128c. Each of the plurality of second touch electrodes 128b is arranged electrically insulated from a second touch electrode 128b adjacent in the second direction. A so-called projected capacitance type touch sensor is formed by the plurality of first touch electrodes 128a and the plurality of second touch electrodes 128b. The projected capacitance method may be a self-capacitance method or a mutual capacitance method. The display device 100 which has the input function related to the present embodiment can adopt any of these methods.

In the self-capacitance method, when a detection target such as a person's finger touches or comes close to the display region 102a via the first touch electrode 128a and the second touch electrode 128b (hereinafter, when touching and approaching are collectively referred to as touch), a capacitance generated between the detection target and the first touch electrode 128a and the second touch electrode 128b is added to a parasitic capacitance of the first touch electrode 128a and the second touch electrode 128b. The position of the touch in the display region 102a is detected by detecting the change in the capacitance.

In the mutual capacitance method, one of the first touch electrode 128a and the second touch electrode 128b is also called a transmission electrode (Tx), and the other is also called a receiving electrode (Rx). When a detection target such as a person's finger touches the display region 102a via the first touch electrode 128a and the second touch electrode 128b, the capacitance formed by the first touch electrode 128a and the second touch electrode 128b changes and the position of the touch is detected by detecting this change.

The display device 100 related to the present embodiment can be applied to either of the self-capacitance method and the mutual capacitance method.

The periphery region 102b is a region which contacts a periphery edge of the display region 102a and surrounds the display region 102a. A first touch wiring 128e which is connected to each of the plurality of first touch electrodes 128a and a second touch wiring 128f which is connected to each of the plurality of second touch electrodes 128b are arranged in the periphery region 102b. The first touch wiring 128e is connected to any one of a plurality of connection wirings 108e. Similarly, the second touch wiring 128f is connected to any one of the plurality of connection wirings 108e. Each of the plurality of connection wirings 108e is connected to any one of the plurality of connection terminals 132. In this way, each of the plurality of first touch electrodes 128a and the plurality of second touch electrodes 128b is electrically connected to any of the plurality of connection terminals 132.

A periphery circuit (not shown in FIG. 1) for controlling light emitted by a plurality of display elements, and an IC chip 106 for controlling the periphery circuit may be further arranged in the periphery region 102b. Among the plurality of display elements arranged in a matrix shape, a scanning line drive circuit for selecting a row to which video data is written and a video line drive circuit or the like for supplying a voltage corresponding to the video data to each of a plurality of display elements may be included as a peripheral circuit.

A first protective layer 126 which is arranged above the plurality of display elements and below the touch electrode layer is shown in FIG. 1. Although the details of the first protective layer 126 are described hereafter, the first protective layer 126 has at least one opening 126a. The opening 126a is arranged in a region which overlaps a part of each of at least the plurality of connection wirings 108e. In the present embodiment, the number of openings 126a is one, and the opening 126a is arranged in a region which overlaps a part of each of the plurality of connection wirings 108e. Each of the first touch wirings 128e and the second touch wirings 128f which are arranged above the first protective layer 126 is connected to any of the plurality of connection wirings 108e via the opening 126a.

Furthermore, although the number of openings 126a is one in the present embodiment, it is not limited to one. The number of openings 126a may more than one, and may be arranged in a region which overlaps with a part of each of the plurality of connection wirings 108e.

The terminal region 102c is a region for connecting the display device 100 and a flexible circuit substrate (FPC substrate) 140 or the like. The terminal region 102c may be arranged along one side of the display device 100, and the plurality of connection terminals 132 are arranged. Each of the plurality of connection terminals 132 is electrically connected to one of the plurality of connection wirings 108e.

Figure 2:
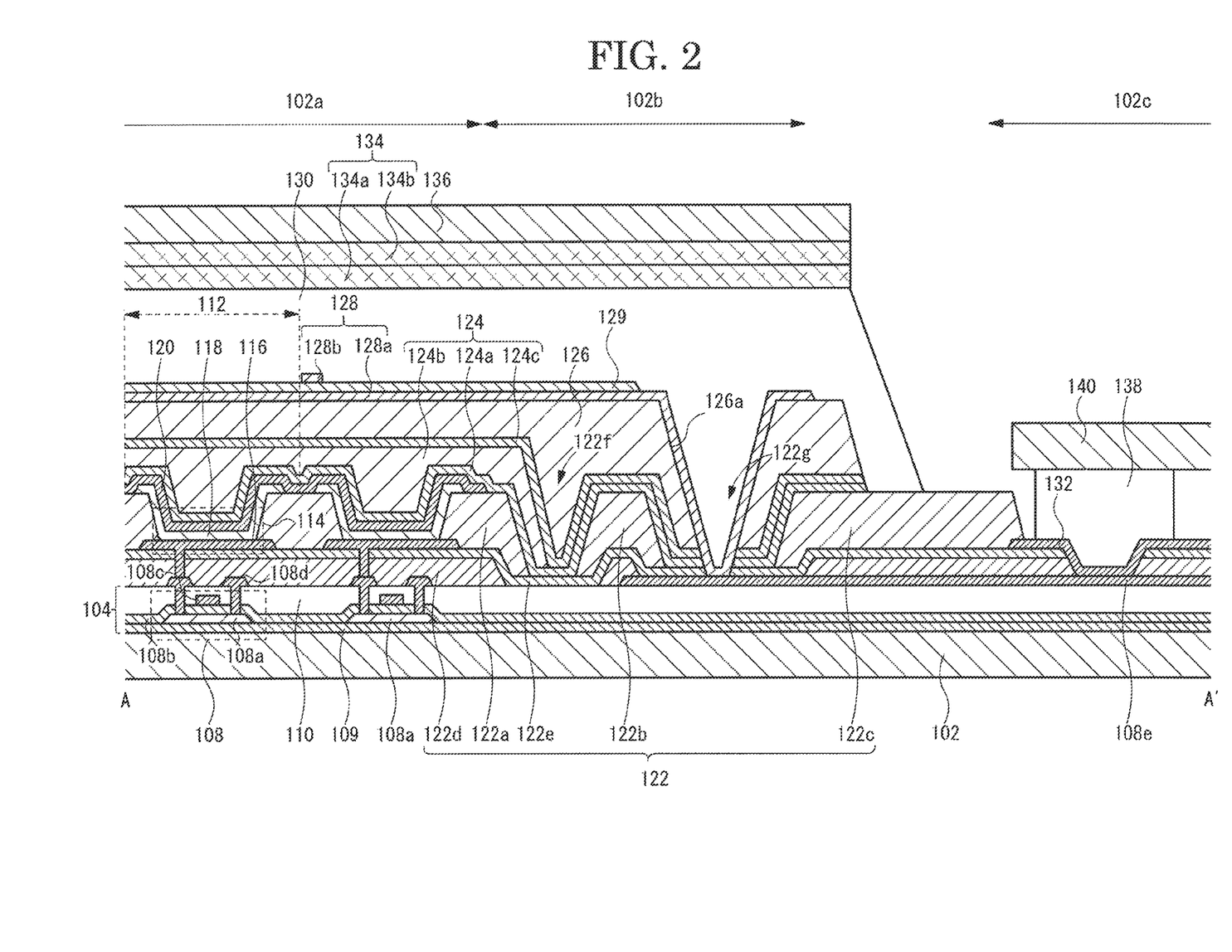
FIG. 2 is a cross-sectional diagram for explaining the structure of a display device related to one embodiment of the present invention.

FIG. 2 is a cross-sectional diagram for explaining the structure of the display device 100 related to the present embodiment, and shows the structure of a cross section along the line A1-A2 shown in FIG. 1. The display device 100 is arranged with the substrate 102, a circuit layer 104, a plurality of light emitting elements 114 as a display element, a partition wall layer 122, a sealing layer 124, a first protective layer 126, a touch electrode layer 128, a plurality of terminals 132, a second protective layer 130, a polarization plate 134 and a cover film 136.

The substrate 102 supports each type of elements includes in the circuit layer 104 and the plurality of pixels 112 arranged on the first surface. Glass, quartz, plastic, metal and ceramic or the like is applied as a material of the substrate 102. The substrate 102 is formed from a resin material in the case where flexibility is provided to the display device 100. For example, a polymer material exemplified by polyimide, polyamide, polyester or polycarbonate is applied as the resin material.

The circuit layer 104 is arranged on the first surface of the substrate 102. In the present embodiment, the circuit layer 104 includes a plurality of pixel circuits, a periphery circuit, a plurality of connection wirings 108e and an interlayer insulating layer 110. Each of the plurality of pixel circuits is connected to any one of the plurality of light emitting elements 114 arranged in the display region 102a and controls light emitted from each of the plurality of light emitting elements 114. The periphery circuit is arranged in the periphery region 102b and controls a pixel circuit. Among a plurality of light emitting elements 114 arranged in a matrix, a scanning line drive circuit for selecting a row to which video data is written and an video line drive circuit or the like which supplies a voltage corresponding to the video data to each of the plurality of light emitting elements 114 may be included as a peripheral circuit.

As is shown in FIG. 2, the pixel circuit includes a transistor 108. The transistor 108 includes a semiconductor layer 108a, a gate insulating layer 108b, a gate electrode 108c and a source/drain electrode 108d. The semiconductor layer 108a has an island shape. For example, a Group 14 element such as silicon or an oxide semiconductor and the like is used as a material of the semiconductor layer 108a. For example, an oxide of a Group 13 element such as indium and gallium as the oxide semiconductor can be included and a mixed oxide of indium and gallium (IGO) is exemplified as the oxide semiconductor. In the case where an oxide semiconductor is used for the semiconductor layer 108a, the semiconductor layer 108a may further contain a Group 12 element, a mixed oxide (IGZO) containing indium, gallium and zinc is one example. The crystallinity of the semiconductor layer 108a is not limited and may have any state of single crystal, polycrystal, microcrystalline or amorphous.

The gate insulating layer 108b is arranged above the semiconductor layer 108a. In the present embodiment, the gate insulating layer 108b is arranged across the plurality of transistors 108. However, the gate insulating layer 108b may also be arranged at least in a region which overlaps the gate electrode 108c. It is possible to use silicon nitride, silicon oxide, and silicon oxynitride or the like as a material of the gate insulating layer 108b, and even in a single-layer structure it may have a structure in which an insulating layer including a material selected from these materials is stacked.

The gate electrode 108c overlaps the semiconductor layer 108a interposed by the gate insulating layer 108b therebetween. In the semiconductor layer 108a, a region which overlap the gate electrode 108c is a channel region. A metal such as titanium, aluminum, copper, molybdenum, tungsten or tantalum or an alloy thereof and the like can be used as a material of the gate electrode 108c. A single layer of a conductive layer formed from any of these materials, or a structure in which a plurality of conductive layers formed from a material selected from these are stacked can be formed. For example, a structure in which a conductive layer formed from a metal material having a relatively high melting point such as titanium, tungsten, or molybdenum and in which the upper and lower parts of a conductive layer formed of a highly conductive metal material such as aluminum or copper are held can be adopted.

The source/drain electrode 108d is arranged above the interlayer insulating layer 110. The source/drain electrode 108d is electrically connected to the source/drain region of the semiconductor layer 108a at an opening arranged in the interlayer insulating layer 110 and the gate insulating layer 108b. A connection wiring 108e is further arranged above the interlayer insulating layer 110. That is, as shown in FIG. 2, the connection wiring 108e can be present in the same layer as the source/drain electrode 108d. In addition, the present embodiment is not limited thereto, and the connection wiring 108e may be formed to be present in the same layer as the gate electrode 108c (not shown in FIG. 2).

Although a top gate type transistor is exemplified in FIG. 2 as the transistor 108, the structure of the transistor 108 is not limited thereto, and a bottom gate transistor, a multi-gate transistor including a plurality of gate electrodes 108c, and a dual gate type transistor which has a structure in which two gate electrodes 108c sandwich above and below the semiconductor layer 108a are possible. In addition, although an example in which one transistor 108 is arranged in one pixel circuit is exemplified in FIG. 2, one pixel circuit may further include a plurality of transistors 108 and semiconductor elements such as a capacitor.

Each of the plurality of connection wirings 108e is connected to any one of the plurality of connection terminals 132. The plurality of connection wirings 108e may be arranged in the same layer as the source/drain electrode 108d of a transistor and may also be formed using the same material. From this, it is possible to form the plurality of connection wirings 108e and the source/drain electrodes 108d using the same process.

The interlayer insulating layer 110 covers a pixel circuit and a periphery circuit. The base layer 109 is an arbitrary configuration and is arranged below a pixel circuit, a periphery circuit and the plurality of connection wirings 108e. The base layer 109 is a layer for preventing impurities such as an alkali metal from diffusing from the substrate 102 (and a film layer) into the transistor 108 and the like. An inorganic insulating material can be included as the material of the base layer 109. Silicon nitride, silicon oxide, and silicon oxynitride or the like can be used as the inorganic insulating material. In the case when the impurity concentration within the substrate 102 is low, the base layer 109 is either not arranged or may be formed to cover only a part of the substrate 102.

The interlayer insulating layer 110 is arranged above a pixel circuit and a periphery circuit. It is possible to use a material which can be used for the base layer 109 as a material of the interlayer insulating layer 110, and a single layer structure or a stacked structure selected from these materials can be used.

The plurality of light emitting elements 114 are arranged above the circuit layer 104. Each of the plurality of light emitting elements 114 includes a first electrode 116, a light emitting layer 118 and a second electrode 120 stacked from the substrate 102 side. Carriers are injected from the first electrode 116 and the second electrode 120 into the light emitting layer 118, and carrier recombination occurs within the light emitting layer 118. In this way, light emitting molecules within the light emitting layer 118 are in an excited state, and light emission is obtained via a process of relaxing to a ground state.

The first electrode 116 is arranged further above a planarization insulating layer 122d described in detail hereafter. The first electrode 116 also covers an opening arranged in the planarization insulating layer 122d and an inorganic insulating layer 122e and is arranged to be electrically connected to the source/drain electrode 108d. In this way, a current is supplied to a light emitting element 114 via the transistor 108. In the case when light emitted from the light emitting element 114 is extracted from the second electrode 120 side, a material of the first electrode 116 is selected from materials which can reflect visible light. In this case, the first electrode 116 is formed using a metal having a high reflectance such as silver or aluminum or an alloy of these. Furthermore, a conductive oxide layer having light-transmitting properties may be formed above the layer containing these metals and alloys. Examples of the conductive oxide are ITO and IZO and the like. In the case when light emitted from the light emitting element 114 is extracted from the first electrode 116, a conductive oxide such as ITO or IZO is used as a material of the first electrode 116.

The light emitting layer 118 is arranged to cover the first electrode 116 and the first partition wall 122a. The structure of the light emitting layer 118 can be appropriately selected and can be formed for example, by combining a carrier injection layer, a carrier transport layer, the light emitting layer 118, a carrier blocking layer and an exciton blocking layer and the like. The light emitting layer 118 can be formed so as to include different materials for each light emitting element 114. It is possible to obtain different emitting colors for each light emitting element 114 by appropriately selecting a material used for the light emitting layer 118. Alternatively, the structure of the light emitting layer 118 may be the same between light emitting elements 114. In such a structure, since the same emission color is output from the light emitting layer 118 of each light emitting element 114, for example, the light emitting layer 118 may be formed so that it can emit white light, and various colors (for example, red, green and blue) may be extracted from the light emitting element 114 by using a color filter respectively.

The second electrode 120 is arranged above the light emitting layer 118. The second electrode 120 may also be arranged in common to the plurality of light emitting elements 114. In the case when light emitted from the light emitting element 114 is extracted from the second electrode 120, the material of the second electrode 120 side is selected from conductive oxides such as ITO which have light transmitting properties. Alternatively, the second electrode 120 may be formed to a thickness which allows visible light to pass through the coating of metal such as silver or aluminum or an alloy thereof described above. In this case, a conductive oxide which has translucency may be further stacked overlapping the metal film.

The partition wall layer 122 is arranged above the circuit layer 104. In the present embodiment, the partition wall layer 122 includes a first partition wall 122a, a second partition wall 122b, a third partition wall 122c, a planarization insulating layer 122d and an inorganic insulating layer 122e.

The first partition wall 122a is arranged between adjacent pixels 112 among the plurality of pixels 112 in a planar view, and surrounds each of the plurality of pixels 112. The first partition wall 122a covers the periphery edge of the surface of the first electrode 116 on the light emitting layer 118 side. Disconnection of the light emitting layer 118 and the second electrode 120 arranged above can be prevented when the periphery edge of the first electrode 116 is covered by the first partition wall 122a. In a planar view, a region where the first electrode 116 and the light emitting layer 118 are in contact is a light emitting region.

The second partition wall 122b has a gap with the first partition wall 122a in a planar view, and has a periphery shape which surrounds the first partition wall 122a. In other words, a periphery shaped groove 122f is formed between the second partition wall 122b and the first partition wall 122a. That is, the second partition wall 122b is separated from the first partition wall 122a in planar view. Although described in detail herein, when forming an organic insulating layer 124b which forms the sealing layer 124 in the manufacturing process, it is necessary that the organic insulating layer 124b covers the display region 102a and is selectively formed in a region within the first surface of the substrate 102 so that it does not spread to the end part of the substrate 102. When the organic insulating layer 124b spreads to the end part of the substrate 102, there is a danger that moisture may enter into the display device 100 via the organic insulating layer 124b which is exposed at the end part. The organic insulating layer 124b is selectively coated on the display region 102a using an inkjet method for example. At this time, the second partition wall 122b has a blocking function so that the organic insulating layer 124b does not spread to the exterior thereof.

The third partition wall 122c has a gap with the second partition wall 122b in a planar view and has a periphery shape surrounding the second partition wall 122b. In other words, a periphery shaped groove part 122g is formed between the third partition wall 122c and the second partition wall 122b. Furthermore, the third partition wall 122c is an arbitrary configuration and does not have to be arranged. On the other hand, another periphery partition wall having a gap with the third partition wall 122c and surrounding the third partition wall 122c may be further arranged.

It is possible to use organic insulation materials such as an epoxy resin and an acrylic resin for example as a material of the first partition wall 122a, the second partition wall 122b and the third partition wall 122c. The groove part 122f and the groove part 122g can be easily formed by manufacturing the first partition wall 122a, the second partition wall 122b and the third partition wall 122c using a photosensitive organic insulating material.

The planarization insulating layer 122d is arranged above the circuit layer 104 and below the light emitting element 114. The planarization insulating layer 122d absorbs unevenness caused by a semiconductor element such as the transistor 108 and provides a flat surface. A material similar to a material which can be used for the first partition wall 122a, the second partition wall 122b and the third partition wall 122c can be used as a material of the planarization insulating layer 122d.

The inorganic insulating layer 122e is an arbitrary configuration and has a function for protecting a semiconductor element such as the transistor 108. Furthermore, it is possible to form a capacitance between the first electrode 116 of the light emitting element 114 and an electrode (not shown in FIG. 2) formed below the inorganic insulating layer 122e so as to sandwich the first electrode 116 and the inorganic insulating layer 122e.

The planarization insulating layer 122d and the inorganic insulating layer 122e are arranged with a plurality of openings. One of the openings is arranged to electrically connect the first electrode 116 of the light emitting element 114 and the source/drain electrode 108d of the transistor 108. Another one of the openings is arranged to expose a part of the connection wiring 108e. The connection wiring 108e which is exposed by the opening is electrically connected to a connection terminal 132 formed thereon. For example, it is connected to the FPC substrate 140 by an anisotropic conductive film 138 or the like.

The sealing layer 124 is arranged above the plurality of light emitting elements 114 and the partition wall layer 122. In the present embodiment, the sealing layer 124 includes a first inorganic insulating layer 124a, an organic insulating layer 124b and a second inorganic insulating layer 124c stacked from the substrate 102 side.

The first inorganic insulating layer 124a covers an uneven surface caused by the partition wall layer 122. The first inorganic insulating layer 124a covers the bottom surface side surface of the groove part 122f between the first partition wall 122a and the second partition wall 122b. The first inorganic insulating layer 124a also covers the bottom surface and side surface of the groove part 122g between the second partition wall 122b and the third partition wall 122c.

In the present embodiment, the first inorganic insulating layer 124a has at least the following three roles. The organic insulating layer 124b through which moisture easily passes is arranged above the first inorganic insulating layer 124a and is arranged so as not to contact a light emitting element 114. In this way, it is possible to prevent moisture which is contained in the organic insulating layer 124b or moisture which enters the organic insulating layer 124b from the exterior of the display device 100 from reaching the light emitting layer 118 and deteriorating the light emitting layer 118. In addition, the first inorganic insulating layer 124a is arranged in order to prevent a moisture entrance path from being generated via an organic material between the first partition wall 122a and the second partition wall 122b. In this way, it is possible to prevent moisture which is contained in the second partition wall 122b or moisture which enters the second partition wall 122b from the exterior of the display device 100 from entering the second partition wall and deteriorating the light emitting layer 118. Furthermore, the first inorganic insulating layer 124a is arranged in order to prevent a moisture entrance path from being generated through an organic material between the second partition wall 122b and the third partition wall 122c. In this way, it is possible to prevent moisture which is contained in the third partition wall 122c or moisture which enters the third partition wall 122c from the exterior of the display device 100 from entering the third partition wall 122c and deteriorating the light emitting layer 118.

From the above, it is preferred to use an insulating material having low moisture permeability for the material of the first inorganic insulating layer 124a. It is preferred to use an inorganic insulating material as an insulating material having low moisture permeability. For example, silicon oxide, silicon nitride, silicon oxynitride, aluminum oxide, aluminum nitride, and aluminum oxynitride or the like can be used as the inorganic insulating material. In addition, a structure in which can be used in which a plurality of materials selected from these are stacked.

The organic insulating layer 124b is arranged above the first inorganic insulating layer 124a. The organic insulating layer 124b also overlaps the plurality of light emitting elements 114 in a planar view, and the end part thereof is arranged between the first partition wall 122a and the second partition wall 122b. The organic insulating layer 124b is arranged in order to planarize unevenness caused by the first partition wall 122a and the like.

When this unevenness is not sufficiently planarized and the second inorganic insulating layer 124c is arranged above the organic insulating layer 124b, the second inorganic insulating layer 124c can not sufficiently cover any unevenness which remains on the organic insulating layer 124b, a defect such as a crack may occur in the second inorganic insulating layer 124c, and a moisture entrance path may be generated as a result. However, it is possible to embedded and planarize unevenness in a base surface by arranging the organic insulating layer 124b.

The second inorganic insulating layer 124c is arranged above the organic insulating layer 124b. In the present embodiment, the second inorganic insulating layer 124c is arranged along the end part of the first inorganic insulating layer 124a in a planar view. That is, both surfaces and the end parts of the organic insulating layer 124b are covered by the first inorganic insulating layer 124a and the second inorganic insulating layer 124c. By providing this type of structure, it is possible to block a moisture entrance path from the exterior to the interior of the display device 100 through the organic insulating layer 124b. An insulating material having low moisture permeability is preferred to be used as a material of the second inorganic insulating layer 124c, and it is possible to use the same material as the first inorganic insulating layer 124a.

Furthermore, it is not always necessary to arrange the end part of the second inorganic insulating layer 124c along the end part of the first inorganic insulating layer 124a. The sealing layer 124 may be formed so that that the organic insulating layer 124b is sealed by the first inorganic insulating layer 124a and the second inorganic insulating layer 124c.

The first protective layer 126 is arranged above the sealing layer 124. The first protective layer 126 also includes an opening part 126a in a region which overlaps a part of each of at least a plurality of connection wirings 108e in a planar view. In the present embodiment, the opening part 126a is arranged in the groove part 122g between the second partition wall 122b and the third partition wall 122c in a planar view. Furthermore, the region where the opening part 126a is arranged is not restricted to the groove part 122g between the second partition wall 122b and the third partition wall 122c. The region where the opening part 126a is arranged may also be further to the exterior than the first partition wall 122a. In addition, as is shown in FIG. 2, the opening part 126a has a tapered shape in a cross-sectional view. In other words, the opening part 126a which arranged in the first protective layer 126 is inclined so that a side wall within the opening part opens towards the exterior as it moves in an upwards direction.

An end part of the first protective layer 126 is arranged above the third partition wall 122c. In the present embodiment, the end part of the first protective layer 126 is arranged along the end part of the first inorganic insulating layer 124a. In the present embodiment, although the end parts of the first protective layer 126, the second inorganic insulating layer 124c and the first inorganic insulating layer 124a almost overlap each other and are arranged above the third partition wall 122c, the present invention is not limited to this embodiment and these layers do not have to overlap the plurality of connection terminals 132. The same material as the material which can be used for the organic insulating layer 124b described above can be used as a material for the first protective layer 126.

The touch electrode layer 128 is arranged above the first protective layer 126. The touch electrode layer 128 includes a plurality of touch electrodes. FIG. 2 shows a form in which the first touch electrode 128a and the second touch electrode 128b are included as the touch electrode layer 128. The first touch electrode 128a and the second touch electrode 128b are arranged via an insulating layer 129. Each of the plurality of touch electrodes is connected to any one of the plurality of connection wirings 108e via the opening part 126a which is arranged in the first protective layer 126.

In the present embodiment, the first protective layer 126 absorbs unevenness caused by the second partition wall 122b, a taper of the end part of the organic insulating layer 124b, and unevenness of other parts of the periphery region 102b and can form a planarized surface. The touch electrode layer 128 is arranged above the surface which is planarized by the first protective layer 126.

In a conventional display device, a plurality of touch electrodes is arranged directly above the sealing layer 124. In this type of structure, the touch electrode layer 128 is arranged above a surface which has unevenness caused by the second partition wall 122b, the taper of the end part of the organic insulating layer 124b and the unevenness of other parts of the periphery region 102b. As a result, in the process of manufacturing the display device, there is concern that disconnections may occur in the plurality of touch electrodes or cracks and the like may be generated caused to the unevenness.

However, according to the present embodiment, by arranging the touch electrode layer 128 on a surface which is planarized by the first protective layer 126, it is possible to suppress the occurrence of disconnections or cracks in the plurality of touch electrodes. In this way, it is possible to improve the reliability of the display device 100.

The plurality of connection terminals 132 are arranged above the first surface of the substrate 102. Each of the plurality of connection terminals 132 is electrically connected to the connection wiring 108e via an opening which is arranged in the inorganic insulating layer 122e and the planarization insulating layer 122d. The plurality of connection terminals 132 are also arranged on the exterior of the first protective layer 126 in a planar view.

The second protective layer 130 is an arbitrary configuration and physically protects the display device 100. It is possible to include a polymer material such as an ester, an epoxy resin or an acrylic resin as the material of the second protective layer 130. The second protective layer 130 can be formed by applying a printing method or a laminating method.

The polarization plate 134 can include, for example, a stacked structure of a λ/4 plate 134a and a linear polarization plate 134b arranged thereon. After light which is incident from the exterior of the display device 100 passes through the linear polarization plate 134b and becomes linearly polarized light, it passes through the λ/4 plate 134a and becomes clockwise circularly polarized light. When this circularly polarized light is reflected by the first electrode 116, it becomes counterclockwise circularly polarized light, then again passes though the λ/4 plate 134a and becomes linearly polarized light. The polarization plane of the linearly polarized light at this time is orthogonal to the linearly polarized light before reflection. Therefore, the light cannot pass through the linear polarization plate 134b. As a result, it is possible to provide an image with high contrast by arranging the polarization plate 134 so that reflection of external light is suppressed.

The cover film 136 is an arbitrary configuration and is arranged above the polarization plate 134 in the present embodiment. The cover film 136 physically protects the polarization plate 134.

The display device 100 according to the present embodiment, it is possible to suppress the occurrence of disconnections or cracks and the like in a plurality of touch electrodes. In this way, it is possible to improve the reliability of the display device 100.

Next, a method of manufacturing the display device 100 according to the present embodiment is explained in detail. FIG. 3 to FIG. 8 are cross-sectional diagrams for explaining the method of manufacturing the display device 100 related to the present embodiment.

Figure 3:
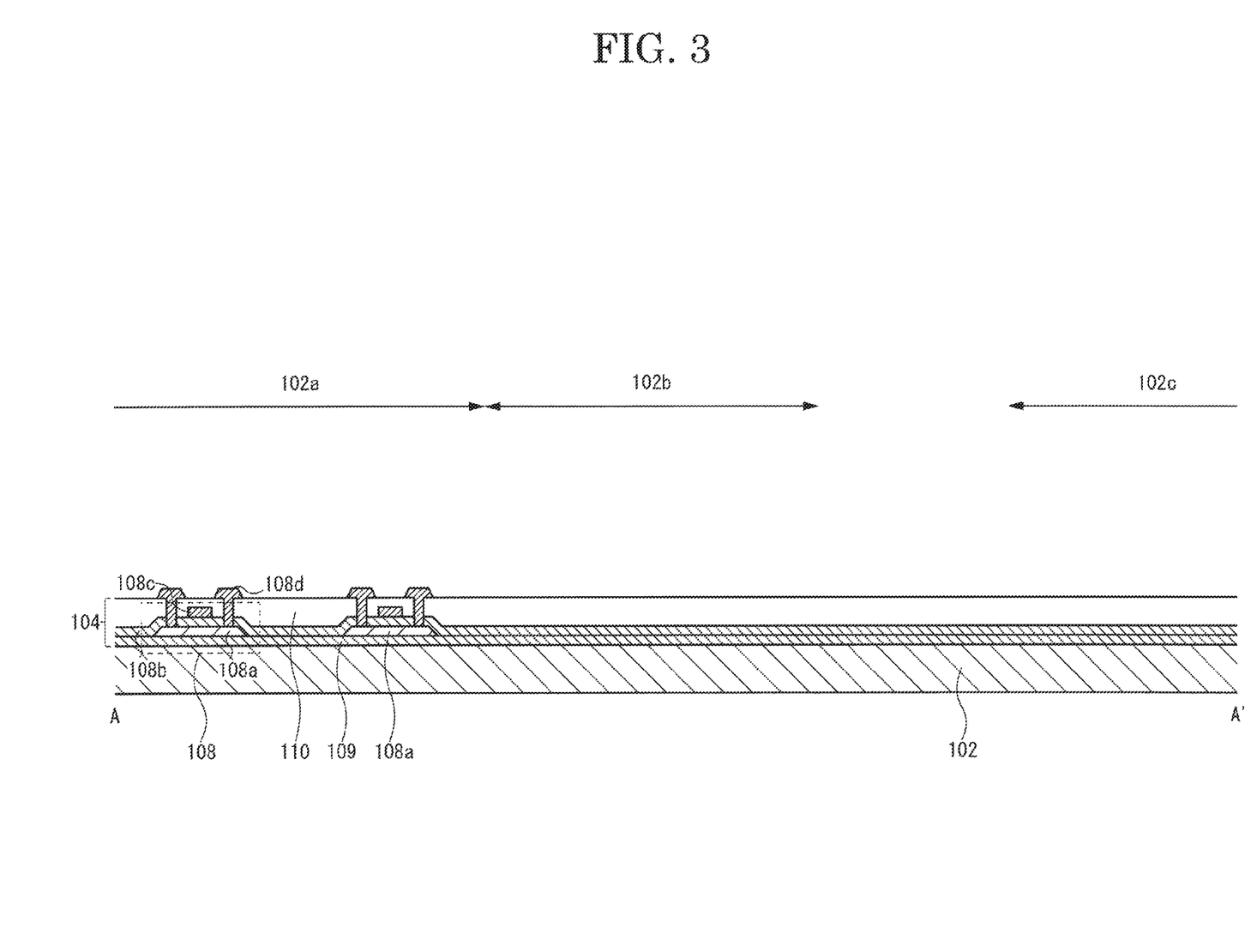
FIG. 3 is a cross-sectional diagram for explaining a manufacturing method of a display device related to one embodiment of the present invention.

In FIG. 3, the substrate 102 supports various elements such as the circuit layer 104 and the plurality of pixels 112 which are arranged on the first surface side of the substrate 102. Therefore, a material which has heat resistance to a process temperature of various elements formed above the substrate 102 and chemical stability with respect to chemicals used in the process may be used for the substrate 102. Glass, quartz, plastic, metal and ceramic and the like can be included as the material of the substrate 102.

In the case where the display device 100 is provided with flexibility, a film layer may be formed above the substrate 102. In this case, the substrate 102 is also called a support substrate. The film layer is an insulating layer having flexibility. Specific materials of the substrate can include, for example, materials selected from polymer materials exemplified by polyimide, polyamide, polyester and polycarbonate. The film layer can be formed, for example, by applying a wet film forming method such as a printing method, an inkjet method, a spin coating method, a dip coating method or a laminating method.

A method for forming the circuit layer 104 on the first surface of the substrate 102 is explained referring to FIG. 3. First, a base layer 109 is formed. An inorganic insulating material can be included as the material of the base layer 109. Silicon nitride, silicon oxide, and silicon oxynitride or the like can be included as the inorganic insulating material. The base layer 109 can be formed having a single layer or a stacked structure by a chemical vapor deposition (CVD) method and a sputtering method or the like. The base layer 109 is an arbitrary configuration and is not necessary to arrange the base layer 109.

The semiconductor layer 108a is formed. The semiconductor layer 108a is formed from a Group 14 element such as silicon or an oxide semiconductor. In the case when the semiconductor layer 108a is formed from silicon, the semiconductor layer 108a is formed by a plasma CVD method using a silane gas or the like as a raw material. An amorphous silicon film formed by a plasma CVD method may be crystallized by a heat treatment or light irradiation using a laser or the like. In the case where the semiconductor layer 108a is formed using an oxide semiconductor, the semiconductor layer 108a can be manufactured using a sputtering method or the like.

The gate insulating layer 108b is formed so as to cover the semiconductor layer 108a. The gate insulating layer 108b may have either a single layer structure or a stacked layer structure and can be formed by a method similar to method for forming the base layer 109.

The gate electrode 108c is formed above the gate insulating layer 108b. A metal such as titanium, aluminum, copper, molybdenum, tungsten or tantalum or an alloy of these metals can be used for the gate electrode 108c. The gate electrode 108c can be formed having a single layer of a film formed from any of these materials, or a stacked structure of films formed from a plurality of materials selected these metals. For example, it is possible to adopt a structure in which a highly conductive metal such as aluminum or copper is sandwiched between metals having a relatively high melting point such as titanium, tungsten or molybdenum. It is possible to form the gate electrode 108c using a sputtering method or a CVD method.

The interlayer insulating layer 110 is formed above the gate electrode 108c. A material which can be used for the base layer 109 can also be used as a material for the interlayer insulating layer 110. The interlayer insulating layer 110 may have a single layer structure or a stacked structure in which a plurality of insulating layers is stacked. The interlayer insulating layer 110 can be formed using the same method as the base layer 109. In the case where the interlayer insulating layer 110 has a stacked layer structure, for example, a layer which includes an inorganic material may be stacked after a layer including an organic material is formed.

Next, the interlayer insulating layer 110 and the gate insulating layer 108b are etched and an opening which reaches the semiconductor layer 108a is formed. It is possible to form the opening, for example, by performing plasma etching in a gas which includes a fluorine-containing hydrocarbon.

A metal layer is formed so as to cover the opening, and etching is performed which forms the source/drain electrode 108d. In the present embodiment, the connection wiring 108e is formed at the same time as the formation of the source/drain electrode 108d. Therefore, the source/drain electrode 108d and the connection wiring 108e can be arranged in the same layer. It is possible for the metal layer to have the same structure as the gate electrode 108c, and the metal layer can be formed using a similar method similar as the formation of the gate electrode 108c.

Figure 4:
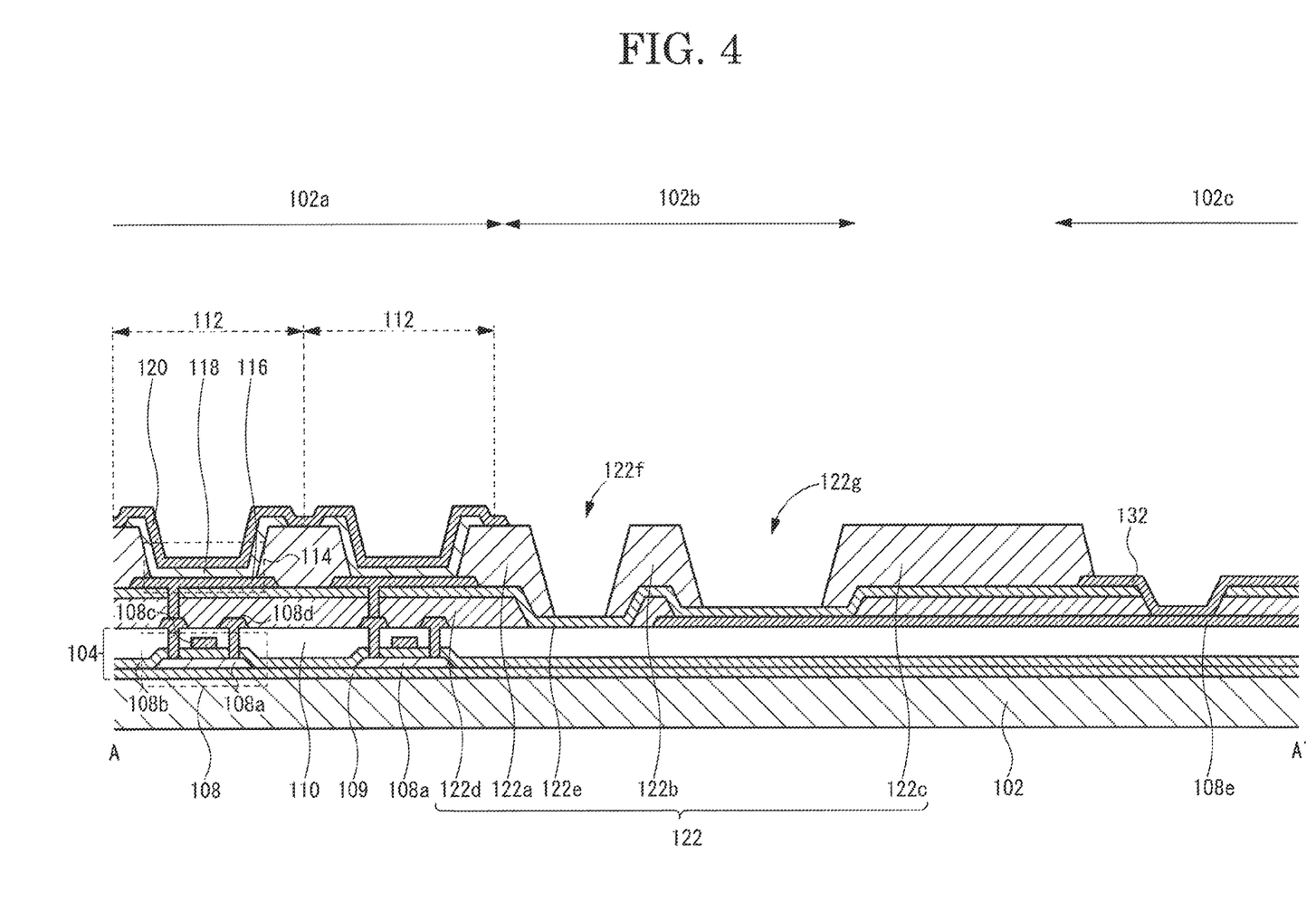
FIG. 4 is a cross-sectional diagram for explaining a manufacturing method of a display device related to one embodiment of the present invention.

A method for forming the plurality of light emitting elements 114, the partition wall layer 122 and the plurality of connection terminals 132 above the first surface of the substrate 102 is explained while referring to FIG. 4. Here, the partition wall layer 122 includes a first partition wall 122a, a second partition wall 122b, a third partition wall 122c, a planarization insulating layer 122d and an inorganic insulating layer 122e. The first partition wall 122a is arranged in the periphery of each of the plurality of pixels 112, the second partition wall 122b surrounds the first partition wall 122a, and the third partition wall 122c surrounds the second partition wall 122b. The connection terminal 132 is arranged on the exterior side of the third partition wall 122c.

A planarization insulating layer 122d is formed. The planarization insulating layer 122d is formed so as to cover the source/drain electrode 108d and the connection wiring 108e. The planarization insulating layer 122d has a function for absorbing unevenness and inclination caused by the transistor 108 and the connection wiring 108e and the like, and for providing a flat surface. It is possible to use an organic insulating material as a material of the planarization insulating layer 122d. Examples of the organic insulating material include polymer materials such as epoxy resin, acrylic resin, polyimide, polyamide, polyester, polycarbonate and polysiloxane. It is possible to form the planarization insulating layer 122d using a wet film formation method or the like.

An inorganic insulating layer 122e is formed above the planarization insulating layer 122d. As described above, the inorganic insulating layer 122e not only functions as a protective layer for the transistor 108 but also forms a capacitance with the first electrode 116 of the light emitting element 114 which is formed subsequently. Therefore, it is preferred to use a material which has a relatively high dielectric constant. For example, it is possible to use silicon nitride, and silicon oxynitride or the like. A CVD method or a sputtering method can be applied as a film formation method.

The inorganic insulating layer 122e and the planarization insulating layer 122d are etched using the source/drain electrode 108d and the connection wiring 108e as etching stoppers and openings are formed. Following this, the first electrode 116 and the connection terminal 132 are formed so as to cover these openings.

In the case when light which is emitted from the light emitting element 114 is extracted from the second electrode 120 side, the first electrode 116 is formed to reflect visible light. In this case, a metal having a high reflectance such as silver or aluminum or an alloy of these is used for the first electrode 116. Alternatively, a conductive oxide layer with light transmitting properties is formed above the layer including these metals and alloys. ITO and IZO are examples of the conductive oxide. In the case where light which is emitted from the light emitting element 114 is extracted from the first electrode 116 side, the first electrode 116 may be formed using ITO or IZO.

In the present embodiment, the first electrode 116 and a connection electrode are formed above the inorganic insulating layer 122e. Therefore, for example, a layer of the metals described above is formed so as to cover the opening, a layer including a conductive oxide which allows visible light to pass through is formed next, and it is possible to form the first electrode 116 and the connection electrode by processing using etching.

The first partition wall 122a, the second partition wall 122b and the third partition wall 122c are formed. The first partition wall 122a can flatten a step caused by an end part of the first electrode 116 and the first partition wall 122a electrically insulates first electrodes 116 of adjacent pixels 112 from each other.

When the organic insulating layer 124b which forms the sealing layer 124 is formed in a later manufacturing process, it is necessary that the organic insulating layer 124b covers the display region 102a and is formed selectively in a region within the surface of the substrate 102 so that it does not spread to the end part of the substrate 102. The organic insulating layer 124b is selectively formed in the display region 102a using an inkjet method for example. At this time, the second partition wall 122b has a blocking function so that the organic insulating layer 124b does not spread to the exterior thereof.

The first partition wall 122a, the second partition wall 122b and the third partition wall 122c can be formed using a wet film formation method using a material that can be used for the planarization insulating layer 122d such as an epoxy resin or an acrylic resin.

The light emitting layer 118 and the second electrode 120 are formed so as to cover the first electrode 116 and the partition wall layer 122. The light emitting layer 118 mainly includes an organic compound and it is possible to form the light emitting layer 118 by applying a wet film forming method such as an inkjet method or a spin coating method or a dry film forming method such as evaporation.

In the case when light which is emitted from the light emitting element 114 is extracted from the first electrode 116 side, a metal such as aluminum, magnesium, silver or an alloy of these may be used as a material for the second electrode 120. Conversely, in the case when light which is emitted from the light emitting element 114 is extracted from the second electrode 120 side, a conductive with light transmitting properties such as ITO may be used as a material for the second electrode 120. Alternatively, it is possible to form the metals described above to a thickness which allows visible light to pass through. In this case, a conductive oxide with light transmitting properties may be further stacked.

Figure 5:
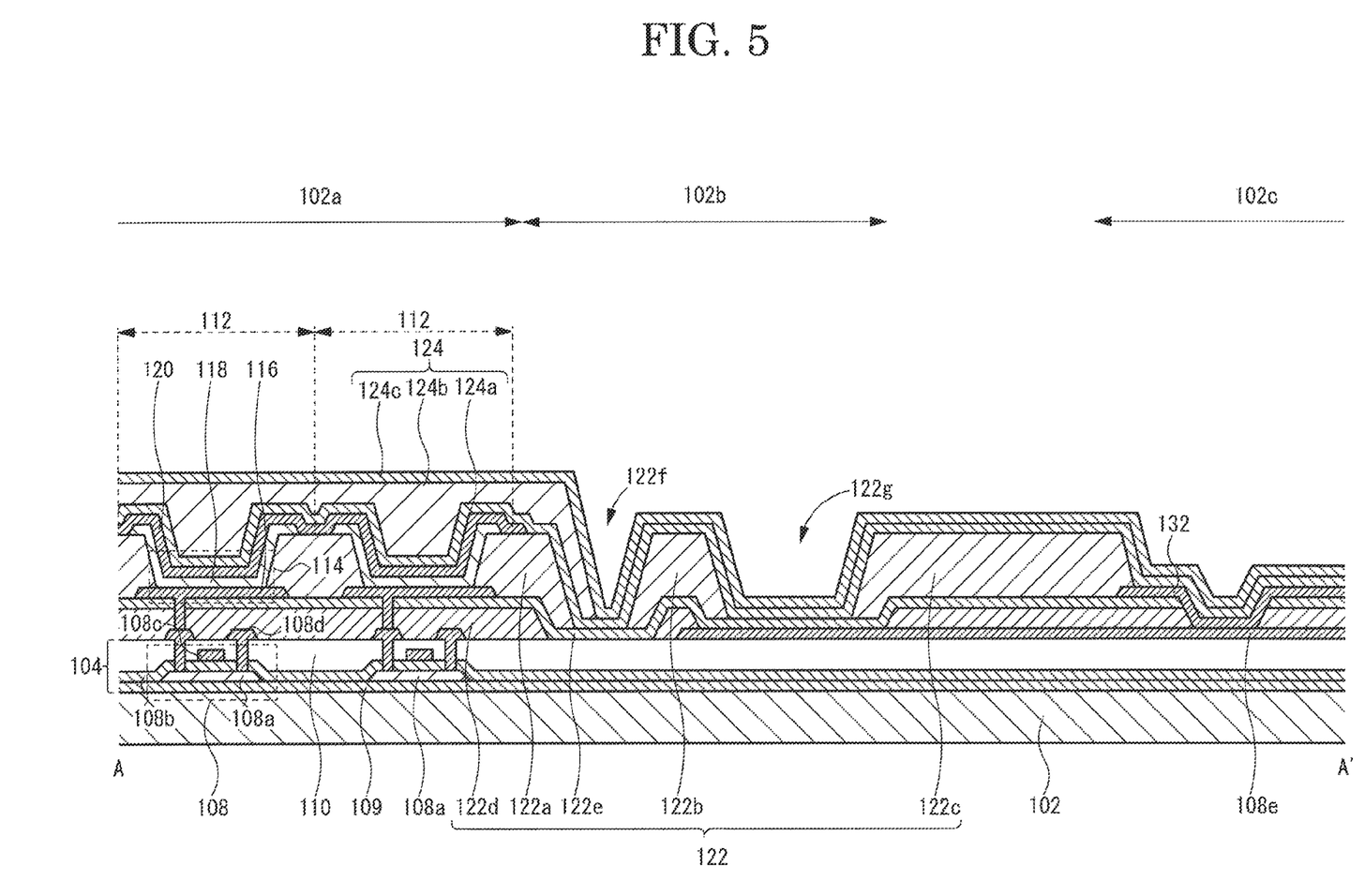
FIG. 5 is a cross-sectional diagram for explaining a manufacturing method of a display device related to one embodiment of the present invention.

A method of forming the sealing layer 124 is explained while referring to FIG. 5. Here, the sealing layer 124 includes a first inorganic insulating layer 124a, an organic insulating layer 124b and a second inorganic insulating layer 124c. The first inorganic insulating layer 124a is arranged disposed across the surface of the substrate 102. The organic insulating layer 124b is arranged above the first inorganic insulating layer 124a, covers the plurality of pixels 112 and is arranged on the inner side of the second partition wall 122b. The second inorganic insulating layer 124c is arranged above the organic insulating layer 124b and across the surface.

First, the first inorganic insulating layer 124a is formed across the first surface of the substrate 102. It is possible to include an inorganic material such as silicon nitride, silicon oxide, or silicon oxynitride and the like for the first inorganic insulating layer 124a and it can be formed by the same method as the base layer 109.

Next, the organic insulating layer 124b is formed. The organic insulating layer 124b is formed by being coated to the inner side of the second partition wall 122b. It is possible to contain an organic resin including an acrylic resin, polysiloxane, polyimide and polyester, and the like for the organic insulating layer 124b. In addition, the organic insulating layer 124b is preferably formed at a predetermined thickness so as to absorb any unevenness caused by the partition wall layer 122 and to provide a flat surface. The organic insulating layer 124b is preferably formed selectively within the display region 102a. That is, the organic insulating layer 124b is preferably formed to not v overlap with the plurality of connection terminals 132. It is possible to form the organic insulating layer 124b by a wet film formation method such as an inkjet method. At this time, the organic insulating layer 124b which is selectively coated to the display region 102a is blocked by the second partition wall 122b and does not spread to the exterior thereof.

The second inorganic insulating layer 124c is formed above the organic insulating layer 124b. The second inorganic insulating layer 124c has the same structure as the first inorganic insulating layer 124a and can be formed using the same method. The second inorganic insulating layer 124c can also be formed to cover not only the organic insulating layer 124b but also cover a connection electrode. In this way, the organic insulating layer 124b can be sealed by the first inorganic insulating layer 124a and the second inorganic insulating layer 124c.

By the processes up to this point, the sealing layer 124 has a three-layer structure which including the first inorganic insulating layer 124a, the organic insulating layer 124b and the second inorganic insulating layer 124c at the inner side the second partition wall 122b, and has a two-layer structure which including the first inorganic insulating layer 124a and the second inorganic insulating layer 124c at the exterior side of the second partition 122b.

Figure 6:
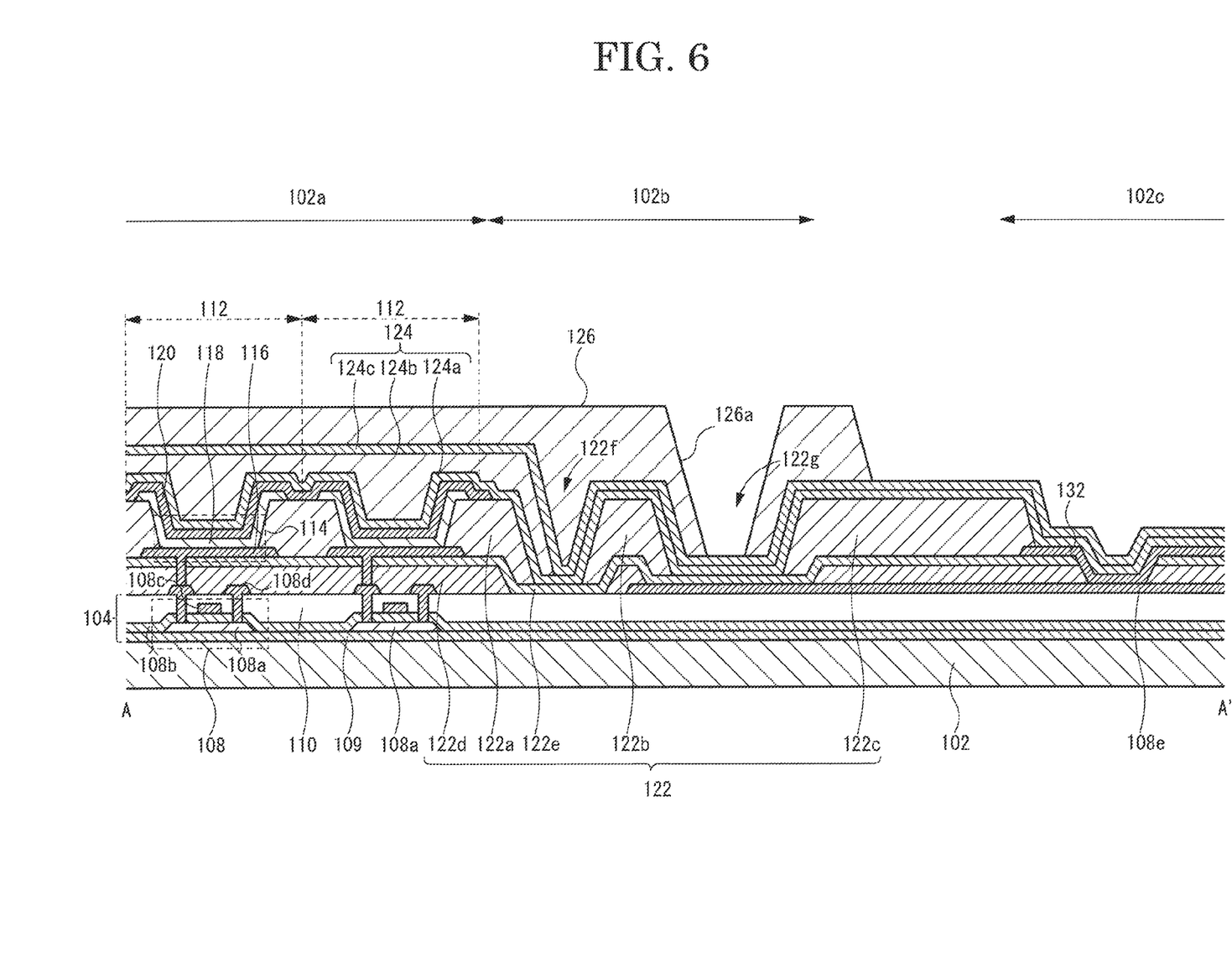
FIG. 6 is a cross-sectional diagram for explaining a manufacturing method of a display device related to one embodiment of the present invention.

A method for forming the first protective layer 126 is explained while referring to FIG. 6. The first protective layer 126 is arranged above the sealing layer 124. As is shown in FIG. 6, the first protective layer 126 selectively covers a region in which the first inorganic insulating layer 124a and the second inorganic insulating layer 124c contact with each other within the display region 102a, has an opening part 126a which is formed in a region which overlaps at least a part of each of the plurality of connection wirings 108e, and is formed so as not to overlap the connection terminal 132. It is possible to include the same material as the organic insulating layer 124b which forms the sealing layer 124 for the first protective layer 126, and similarly, can be formed using an inkjet method or the like.

Figure 7:
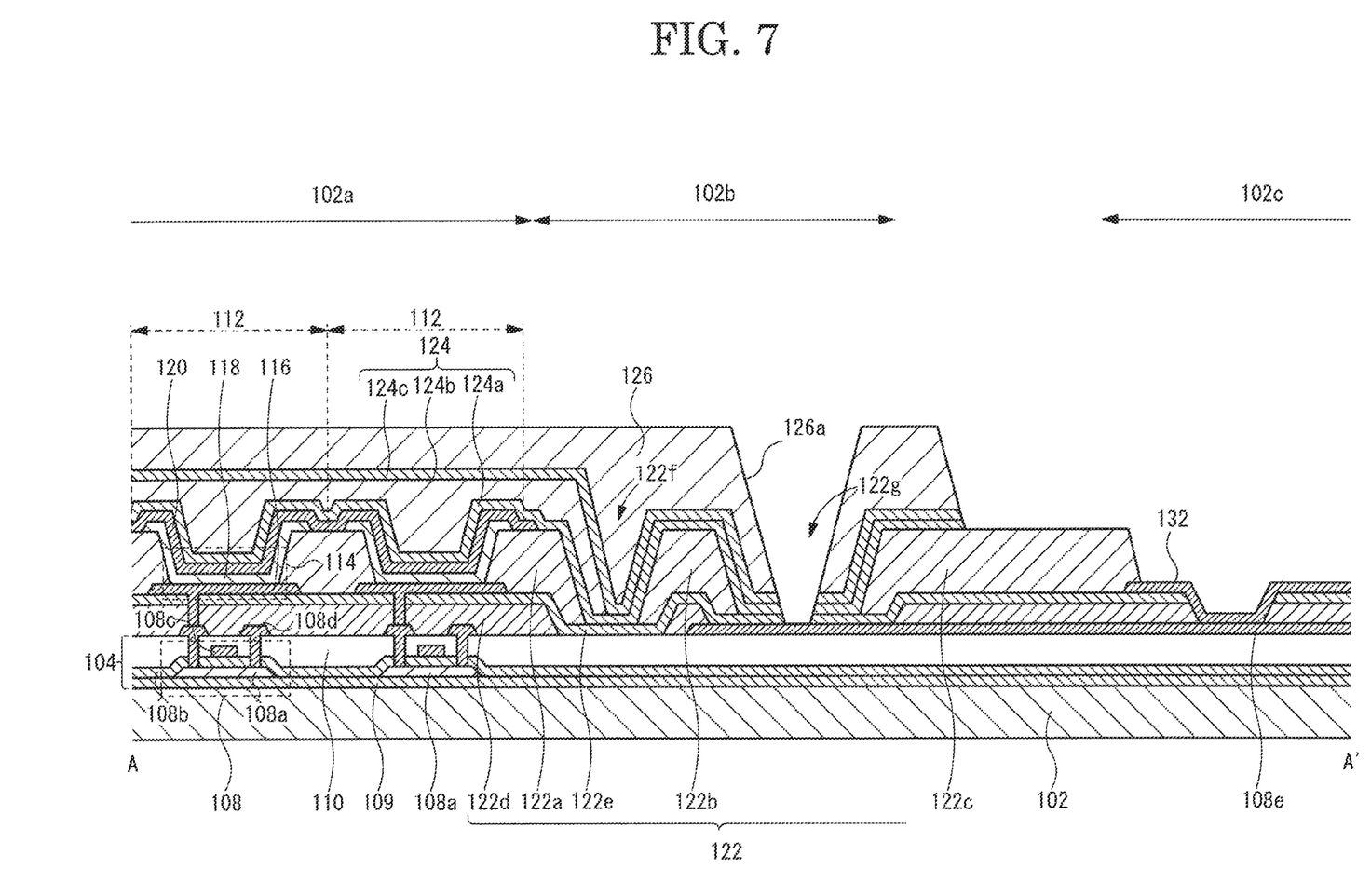
FIG. 7 is a cross-sectional diagram for explaining a manufacturing method of a display device related to one embodiment of the present invention.

A method for exposing a part of each of the plurality of connection terminals 132 and the plurality of connection wirings 108e which are covered by the sealing layer 124 is explained while referring to FIG. 7. Here, the sealing layer 124 is etched using the first protective layer 126 as a mask to expose a part of each of the plurality of connection terminals 132 and the plurality of connection wirings 108e. Here, each region of the sealing layer 124 exposed from the first protective layer 126 is a region which includes a two layer structure of the first inorganic insulating layer 124a and the second inorganic insulating layer 124c.

Figure 8:
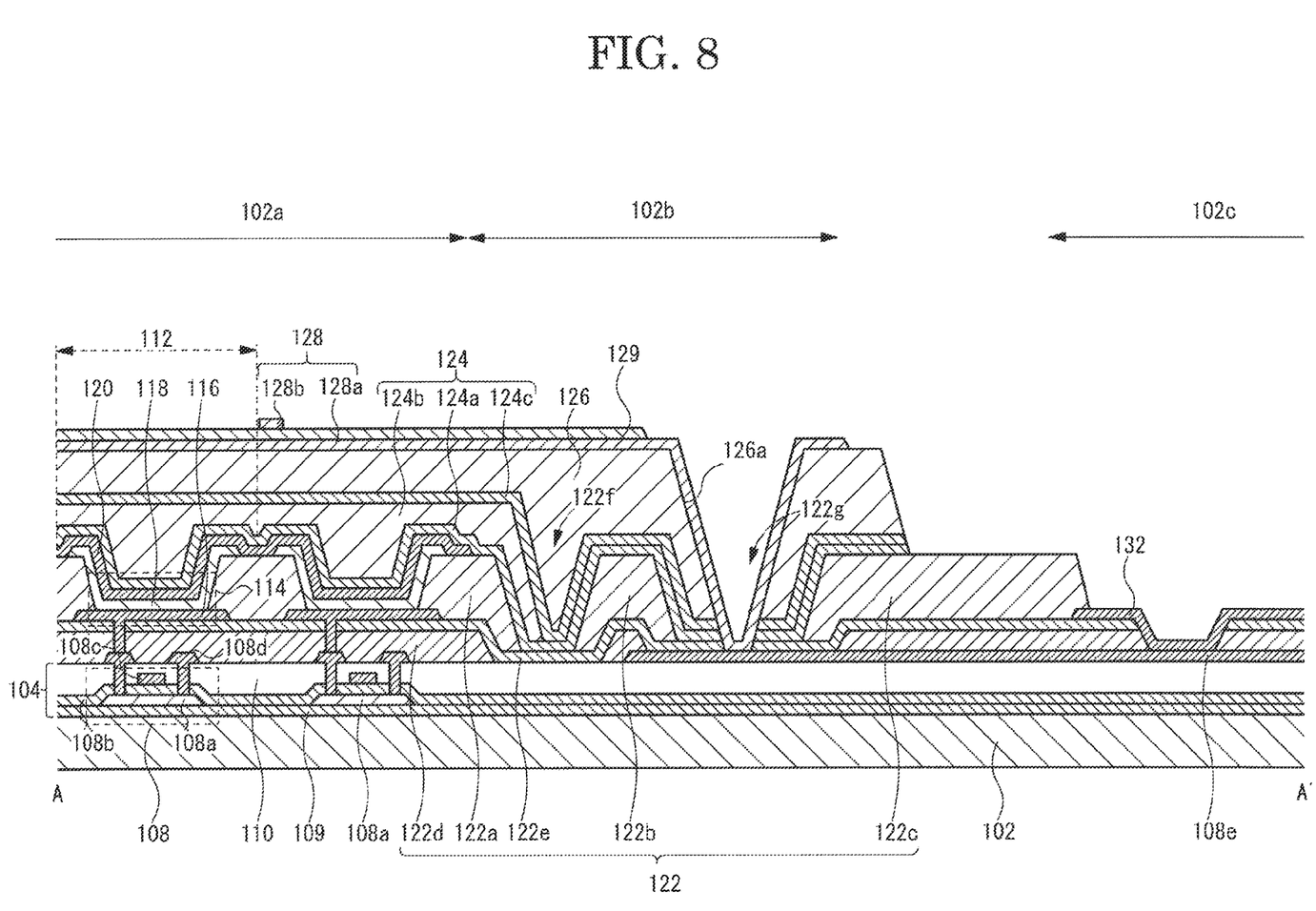
FIG. 8 is a cross-sectional diagram for explaining a manufacturing method of a display device related to one embodiment of the present invention.

A method for forming the touch electrode layer 128 is explained while referring to FIG. 8. First, a plurality of first touch electrodes 128a are simultaneously formed above the first protective layer 126. The plurality of first touch electrodes 128a can include a conductive oxide with light transmitting properties as a main component and ITO and IZO are examples of the conductive oxide. Here, since the first touch wiring 128e which is connected to each of the plurality of first touch electrodes 128a can also be formed using the same material and in the same layer as the plurality of first touch electrodes 128a, it is formed at the same time. The first touch wiring 128e is formed so as to cover the opening part 126a which is arranged in the first protective layer 126, thereby, any one of the first touch electrodes 128a and the plurality of connection wirings 108e is electrically connected.

Next, an organic insulating layer is formed above a first touch electrode 202. The organic insulating layer can be formed using the same material and the same formation method as the first organic layer. The difference from the planarization insulating layer 122d and the like is that a high temperature is not used in the case when a baking process is performed for example. Since the light emitting layer 118 which includes an organic compound is already formed at this time, it is desirable to perform a treatment at a temperature at which the organic compound does not decompose.

The second touch electrode 128b is formed above the organic insulating layer. The same material as the first touch electrode 128a can be used as a material for the second touch electrode 128b. In addition, the second touch wiring 128f is formed at the same time as the formation of the second touch electrode 128b. The second touch wiring 128f is formed so as to cover the opening part 126a which is arranged in the first protective layer 126, thereby each of the plurality of second touch electrodes 128b is electrically connected to any one of the plurality of connection wirings 108e.

The second protective layer 130, the polarization plate 134 and a cover film 136 are formed. The second protective layer 130 can include a polymer material such as polyester, an epoxy resin and an acrylic resin or the like, and can be formed by applying a printing method or a laminating method and the like.

The cover film 136 can also include the same polymer material as the second protective layer 130, and in addition to the polymer materials described above, it is also possible to apply a polymer material such as polyolefin or polyimide. Next, a connector is connected at an opening using the anisotropic conductive film 138 or the like, thereby it is possible to form the display device 100 shown in FIG. 1 and FIG. 2.

According to the present embodiment, since the process of manufacturing the touch electrode layer 128 is performed on the surface which is planarized by the first protective layer 126, it is possible to suppress the occurrence of disconnections or cracks and the like in a plurality of touch electrodes. That is, it is possible to prevent deterioration of the sealing layer 124 in the manufacturing process. In this way, it is possible to provide the display device 100 with improved manufacturing yield and reliability.

Second Embodiment

Figure 9:
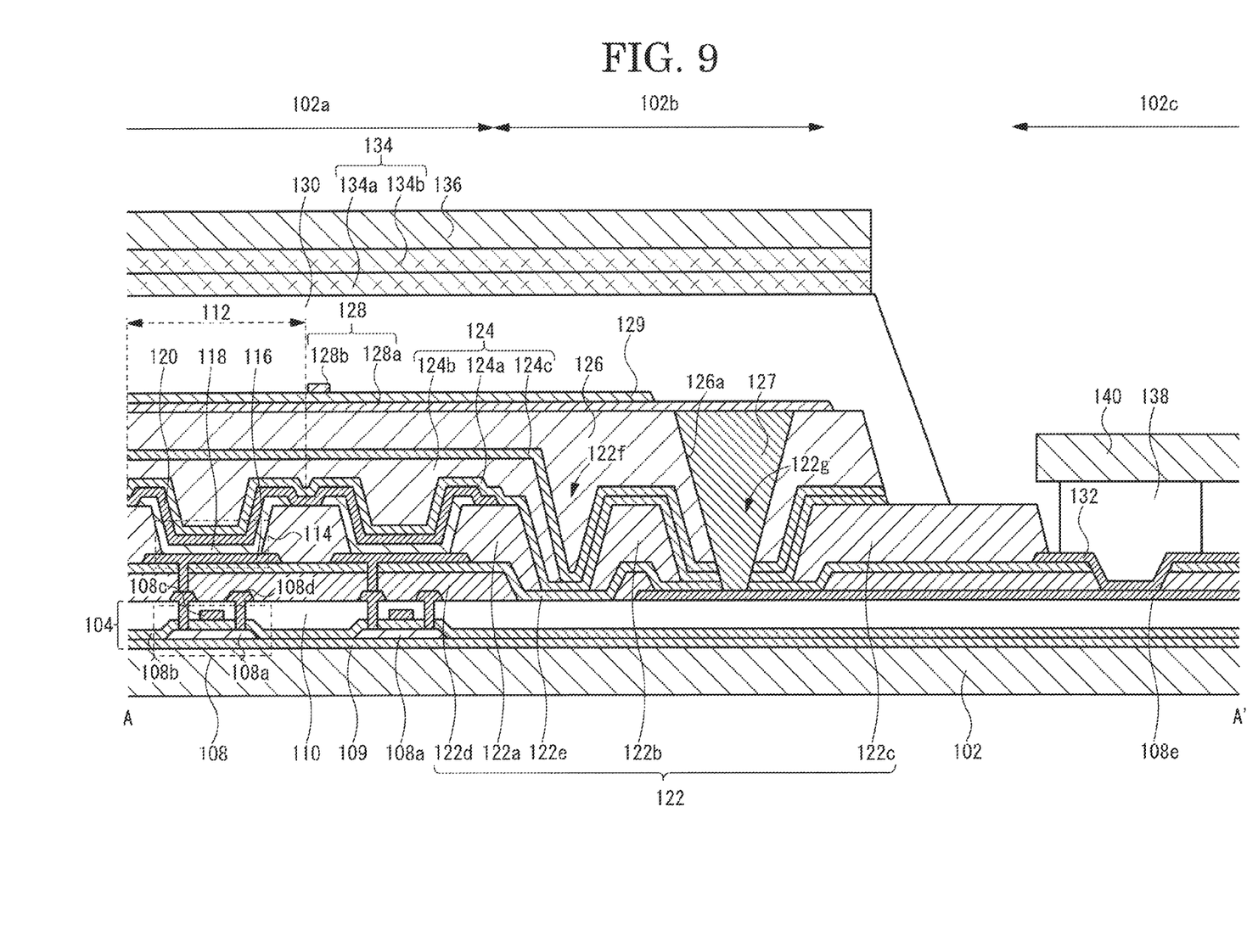
FIG. 9 is a cross-sectional diagram for explaining a structure of a display device related to one embodiment of the present invention.

FIG. 9 is a cross-sectional diagram for explaining the structure of the display device related to the present embodiment. A display device 200 is different from the display device related to the first embodiment in the connection parts between the plurality of touch electrodes and the plurality of connection wirings 108e. In the display device 200, a conductive material which is different from the material of the plurality of touch electrodes is arranged in the opening part 126a of the first protective layer 126. A conductive paste 127 can be used as the conductive material. Each of the plurality of touch electrodes is connected to any one of the plurality of wirings via the conductive paste 127.

The conductive paste 127 is arranged to fill the groove part 122g. The conductive paste 127 has a plug like form by filling the groove part 122g. One end part of the plug (embedded plug) which is formed from the conductive paste 127 is connected to the first touch electrode 128a, and the other end part is connected to the connection wiring 108e. Furthermore, although FIG. 9 shows a form in which the groove part 122g is filled with the conductive paste 127, the present embodiment is not limited to this form and the conductive paste 127 may also be arranged along the side wall of the groove part 122g. In addition, although it is preferred that the top surface of the conductive paste 127 matches the height of the top surface of the first protective layer 126, the first touch electrode 128a may also protrude (depression) from the top surface of the first protective layer 126 at a height (low) which allows a step to be covered. A resin in which gold powder, silver powder, copper powder, nickel powder, aluminum powder, plated powder, carbon powder and graphite powder are dispersed can be used for the conductive paste 127. After this type of conductive paste 127 is arranged in the groove part 122g, it becomes cured state by natural drying or a heat treatment, sufficient conductivity is exhibited in this state, and the first touch electrode 128a and the connection wiring 108e are connected According to the present embodiment, by providing the structure as described above, it is possible to suppress disconnections in a plurality of touch electrodes and the occurrence of cracks and the like caused by a step caused due to the opening part 126a of the first protective layer 126 in the manufacturing process of the display device 200. In this way, it is possible to provide the display device 200 with further improved manufacturing yield and reliability.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

In the present specification, although the case of an EL display device is mainly illustrated as a disclosed example, an electronic paper type display having another self-light emitting display device, a liquid crystal display device, or an electrophoretic element or display devices such as flat panel type display devices can be given as another application example. In addition, it is applicable without particular limitation from medium size to large size.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:
a circuit layer arranged on a first surface of a substrate;
a plurality of display elements arranged on the circuit layer;
a sealing layer arranged on the plurality of display elements;
a protective layer arranged on the sealing layer;
a touch electrode layer arranged on the protective layer; and
a plurality of connection terminals arranged on the circuit layer and an exterior side of the sealing layer,
wherein
the circuit layer includes a plurality of connection wirings respectively connected to any one of the plurality of connection terminals,
the protective layer includes a plurality of opening parts respectively in a region overlapping a part of each of the plurality of connection wirings, each of the opening parts exposing each of the connection wirings,
the touch electrode layer has a plurality of touch electrodes overlapping the display element, and
each of the plurality of touch electrodes is directly connected to any one of the plurality of connection wirings via any one of the plurality of opening parts respectively.

2. The display device according to claim 1, wherein
a partition wall layer is further arranged on the circuit layer,
the partition wall layer includes a first partition wall arranged between display elements within the plurality of display elements and surrounding each of the plurality of display elements, and a second partition wall having a periphery shape and including a gap with the first partition wall and surrounding the first partition wall, and
the plurality of opening parts is arranged further to the exterior side than the first partition wall.

3. The display device according to claim 2, wherein
a third part partition wall having a periphery shape includes a gap with the second partition wall and surrounds the second partition wall, and
the plurality of opening parts overlaps the third partition wall.

4. The display device according to claim 3, wherein
each of the plurality of display elements includes a first electrode, a light emitting layer and a second electrode stacked from the substrate side, and
the first partition wall is arranged between the first electrode and the light emitting layer and covers a periphery edge of the first electrode.

5. The display device according to claim 3, wherein
the sealing layer includes a first inorganic insulating layer, an organic insulating layer and a second inorganic insulating layer stacked from the substrate side,
an upper surface, an under surface, and an end part of the organic insulating layer are covered by the first inorganic insulating layer and the second inorganic insulating layer, and
the organic insulating layer overlaps the plurality of display elements and the end part of the organic insulating layer is arranged between the first partition wall and the second partition wall.

6. The display device according to claim 5, wherein
a first groove part is arranged between the first partition wall and the second partition wall,
the end part of the organic insulating layer overlaps the first groove part, and
an end part of the first inorganic insulating layer and the second inorganic insulating layer overlaps the third partition wall.

7. The display device according to claim 5, wherein
a second groove part is arranged between the second partition wall and the third partition wall, and the plurality of opening parts overlaps the second groove part.

8. The display device according to claim 1 wherein
a conductive paste is further arranged in the plurality of opening parts, and
each of the plurality of touch electrodes is connected to any one of the plurality of connection wirings via the conductive paste.

9. The display device according to claim 8, wherein the conductive paste is filled into the each of the plurality of opening parts.

10. The display device according to claim 1, wherein the circuit layer includes a plurality of pixel circuits, each of the plurality of pixel circuits is connected to any one of the plurality of display elements.

11. The display device according to claim 1, wherein each of the plurality of opening parts has a tapered shape.

12. The display device according to claim 1, wherein the protective layer has a flat surface and the plurality of touch electrodes is arranged above the flat surface.

* * * * *